(12) United States Patent
Ploessl

(10) Patent No.: US 11,127,890 B2
(45) Date of Patent: Sep. 21, 2021

(54) METHOD FOR ASSEMBLING A CARRIER WITH COMPONENTS, PIGMENT FOR ASSEMBLING A CARRIER WITH A COMPONENT AND METHOD FOR PRODUCING A PIGMENT

(71) Applicant: OSRAM OLED GmbH, Regensburg (DE)

(72) Inventor: Andreas Ploessl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 484 days.

(21) Appl. No.: 16/030,714

(22) Filed: Jul. 9, 2018

(65) Prior Publication Data

US 2019/0013450 A1 Jan. 10, 2019

(30) Foreign Application Priority Data

Jul. 10, 2017 (DE) .......................... 102017115410.8

(51) Int. Cl.
*B23K 35/00* (2006.01)
*H01L 33/62* (2010.01)
(Continued)

(52) U.S. Cl.
CPC ............ *H01L 33/62* (2013.01); *B23K 35/025* (2013.01); *B23K 35/368* (2013.01); *H01L 24/16* (2013.01);
(Continued)

(58) Field of Classification Search
CPC ....... H01L 2924/00; H01L 2924/12041; H01L 2224/97; H01L 33/62; H01L 2924/013;
(Continued)

(56) References Cited

U.S. PATENT DOCUMENTS 8,573,469 B2 * 11/2013 Hu .......................... H01L 33/08
228/179.1
9,548,332 B2 * 1/2017 Hu ......................... H01L 27/156
(Continued)

FOREIGN PATENT DOCUMENTS

CN      103682019 A    3/2014
CN      104854965 A    8/2015
(Continued)

OTHER PUBLICATIONS

Notification of Reasons for Refusal issued in Japanese Patent Application No. 2018-130148, dated Jun. 28, 2019.
(Continued)

*Primary Examiner* — Erin B Saad
(74) *Attorney, Agent, or Firm* — Arent Fox LLP

(57) ABSTRACT

The method for assembling a carrier comprises a step A), in which a plurality of pigments (100), each with an electronic component (1), is provided. Further, each pigment comprises a meltable solder material (2) directly adjoining a mounting side (10) of the component. At least 63% by volume of each pigment is formed by the solder material. The mounting side of each component has a higher wettability with the molten solder material than a top side (12) and a side surface (11) of the component. In a step B), a carrier (200) with pigment landing areas (201) is provided, the pigment landing areas having higher wettability with the molten solder material of the pigments than the regions laterally adjacent to the pigment landing areas and than the side surfaces and the top sides of the components. In a step C), the pigments are applied to the carrier. In a step D), the pigments are heated so that the solder material melts.

15 Claims, 7 Drawing Sheets

Figure 1:
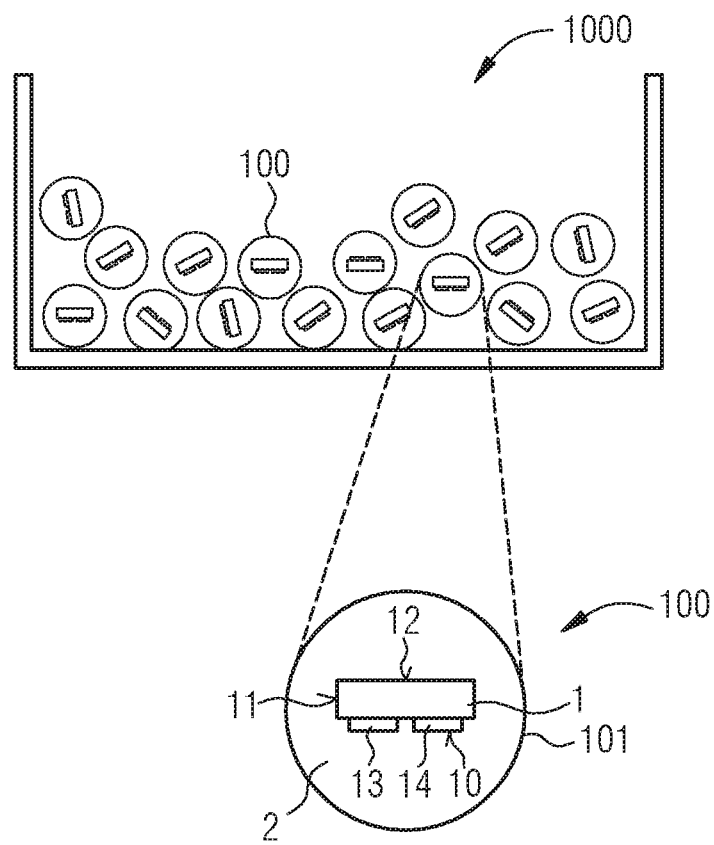

(51) Int. Cl.
*B23K 35/368* (2006.01)
*H01L 33/00* (2010.01)
*H01L 33/36* (2010.01)
*H01L 23/00* (2006.01)
*B23K 35/02* (2006.01)
*B23K 101/40* (2006.01)

(52) U.S. Cl.
CPC .............. *H01L 24/29* (2013.01); *H01L 24/81* (2013.01); *H01L 24/83* (2013.01); *H01L 24/95* (2013.01); *H01L 33/007* (2013.01); *H01L 33/0093* (2020.05); *H01L 33/36* (2013.01); *B23K 2101/40* (2018.08); *H01L 2224/16058* (2013.01); *H01L 2224/16227* (2013.01); *H01L 2224/2901* (2013.01); *H01L 2224/29005* (2013.01); *H01L 2224/29026* (2013.01); *H01L 2224/29105* (2013.01); *H01L 2224/29109* (2013.01); *H01L 2224/29111* (2013.01); *H01L 2224/29113* (2013.01); *H01L 2224/29116* (2013.01); *H01L 2224/29118* (2013.01); *H01L 2224/29139* (2013.01); *H01L 2224/29144* (2013.01); *H01L 2224/81143* (2013.01); *H01L 2224/81815* (2013.01); *H01L 2224/83143* (2013.01); *H01L 2224/83191* (2013.01); *H01L 2224/83815* (2013.01); *H01L 2924/014* (2013.01); *H01L 2924/12041* (2013.01); *H01L 2933/0016* (2013.01); *H01L 2933/0066* (2013.01)

(58) Field of Classification Search
CPC .... H01L 2924/014; H05K 2201/10106; H05K 1/115; H05K 2203/048; H05K 1/111; H05K 2203/047; H05K 13/0465; H05K 2203/044; H05K 3/303; B23K 1/0056; B23K 1/20; B23K 2103/172; B23K 2103/50; B23K 26/364; B23K 26/38; B23K 26/40; B23K 35/3033; B23K 35/322; B23K 3/06; B23K 3/0607; B23K 1/0016; B23K 3/0684; B23K 2101/40; B23K 3/0623

See application file for complete search history.

(56) References Cited

U.S. PATENT DOCUMENTS

| | | | |
|---|---|---|---|
| 9,773,750 B2 * | 9/2017 | Bibl | .................. H01L 24/83 |
| 2007/0007237 A1 | 1/2007 | Wu et al. | |
| 2010/0139954 A1 | 6/2010 | Morris et al. | |
| 2012/0012997 A1 | 1/2012 | Shen et al. | |
| 2015/0093860 A1 | 4/2015 | Hamby et al. | |
| 2015/0208509 A1 * | 7/2015 | Sakai | .................. H01L 24/32 |
| | | | 361/751 |
| 2015/0223346 A1 | 8/2015 | Serre et al. | |

FOREIGN PATENT DOCUMENTS

| | | |
|---|---|---|
| DE | 19524739 A1 | 5/1996 |
| EP | 2688093 A1 | 1/2014 |
| JP | H07-235566 A | 9/1995 |
| JP | H08-18104 A | 1/1996 |
| JP | 2002-280613 A | 9/2002 |
| JP | 2002-353263 A | 12/2002 |
| JP | 2006-511969 A | 4/2006 |
| JP | 2007-235123 A | 9/2007 |
| JP | 2007-335629 A | 12/2007 |
| JP | 2010-045145 A | 2/2010 |
| JP | 2011-071274 A | 4/2011 |
| JP | 2017-501577 A | 1/2017 |
| WO | 2016/043092 A1 | 3/2016 |

OTHER PUBLICATIONS

Oppert, T. et al.:"Wafer level solder bumping and flip chip assembly with solder balls down to 30 ?m" IMapSource, Microelectronics Research Portal, vol. 2011, Issue 1 (Fall 2011).

"Printing the Impossible" NthDegree Technologies Worldwide Inc.; www.ndeg.com, Accessed Jun. 27, 2018.

* cited by examiner

METHOD FOR ASSEMBLING A CARRIER WITH COMPONENTS, PIGMENT FOR ASSEMBLING A CARRIER WITH A COMPONENT AND METHOD FOR PRODUCING A PIGMENT

A method for assembling a carrier with components is specified. In addition, a pigment for assembling a carrier with a component is specified. Furthermore, a method for producing a pigment is specified.

An object to be achieved is to specify a method for an efficient and reliable assembling of a carrier with components. Another object to be achieved is to specify a pigment for such a method. Another object to be achieved is to provide a method for producing such a pigment.

These objects are achieved, inter alia, by the methods and subject matter of the independent patent claims. Advantageous embodiments and further developments are the subject of the dependent claims.

According to at least one embodiment, the method for assembling a carrier with components comprises a step A) in which a plurality of pigments is provided.

According to at least one embodiment, each pigment comprises one, in particular exactly one electronic component with a mounting side, at least one side surface running transversely to the mounting side and a top side opposite the mounting side.

The electronic component is preferably an optoelectronic component, such as an LED or a semiconductor chip, for example an LED chip. The semiconductor chip may be a sapphire chip or a flip-chip or a thin-film semiconductor chip. The semiconductor chip may be a surface-mountable semiconductor chip. During normal operation, the optoelectronic component preferably emits radiation in the visible spectral range.

The mounting side is in particular a main side of the component. The mounting side preferably comprises one or more contact elements for electrical contacting of the component. The mounting side is the side of the component that should be facing the carrier after assembling the carrier with the component.

The top side of the component runs in particular substantially parallel to the mounting side. The top side is therefore preferably also a main side of the component. The top side can form, for example, a luminous surface of the component, via which a large proportion, in particular at least 15% or at least 30% or at least 50% or at least 80% of the radiation emitted by the component is coupled out during normal operation. On the top side, a contact element for electrical contacting of the component can be arranged. Alternatively, the top side can also be free of contact elements.

The side surface connects the mounting side with the top side and runs transversely to the mounting side and to the top side. The side surface bounds the component in the lateral direction parallel to the mounting side.

The electronic component comprises, for example, a semiconductor layer sequence with one, preferably with exactly one contiguous active layer. For example, electromagnetic radiation is generated via the active layer during normal operation. The active layer preferably runs essentially parallel to the mounting side and to the top side. For example, the lateral dimensions of the component substantially correspond to the lateral dimensions of the active layer. In particular, the lateral dimensions of the component are for example at most 105% or at most 110% or at most 120% of the lateral dimension of the active layer.

According to at least one embodiment, each pigment comprises a meltable solder material, which directly adjoins the mounting side of the component and is soldered to the mounting side cohesively.

The solder material on the mounting side of the component is preferably cured. That is, in step A), the pigments are preferably provided at a temperature below the solidus temperature, for example at least 20° C. or at least 50° C. below the solidus temperature of the solder material. But it is also possible that the pigments are provided in step A) at a temperature at which the solder material has already been melted.

The solder material is preferably formed in one piece. Preferably, the solder material consists of a metal or a metal alloy, in particular a eutectic. The solder material is preferably not multilayered.

Furthermore, the solder material is meltable. That is, by heating the pigments to temperatures above the liquidus temperature of the solder material, the solder material is completely liquefied. Preferably, the entire solder material melts in a temperature range of at most 50° C. around the solidus temperature of the solder material.

Furthermore, the solder material is cohesively soldered to the mounting side. That is, for fixing the solder material to the mounting side, the solder material has already been melted once, has partially or completely wetted the mounting side, in particular contact elements of the mounting side, and was then cured again, for example. In particular, the solder material on the mounting side is soldered to a metallic region of the component.

According to at least one embodiment, at least 63% by volume or at least 70% by volume or at least 75% by volume or at least 80% by volume or at least 85% by volume or at least 90% by volume or at least 95% by volume of each pigment is formed by the solder material. In particular, each pigment consists only of the solder material and the electronic component.

According to at least one embodiment, the materials of the solder material, of the mounting side, of the side surface and of the top side are selected such that the mounting side has a higher or stronger or better wettability with the molten solder material than the top side and than the side surface. That is, the materials on the outer surfaces of each component are selected such that the solder material preferably wets the mounting side of the component.

A higher wettability of the mounting side may in particular mean that, when the solder material melts, the solder material wets the mounting side on its own, and the wetting density or the degree of wetting, that is to say the surface portion which is actually wetted, is larger than that of the top side and of the side surfaces. For example, the molten solder material does not wet the top and the side surfaces at all, or at most 20%, or at most 10%, or at most 5% of the respective surfaces of the top side and of the side surfaces. The surface of the mounting side is preferably wetted by the molten solder material to at least 50% or at least 70% or at least 90%. Upon wetting, the molten solder material comes into direct contact with the component. A higher wettability may also mean that the contact angle or critical angle between the molten solder material and the mounting side is smaller, for example at least 20° or at least 40° or at least 60° smaller than between the molten solder material and the top side and the side surfaces.

In particular, for example, the interfacial energy averaged over the entire surface of the mounting side is smaller, for example at least 5 times or at least 10 times or at least 50 times or at least 100 times smaller than the interfacial energies averaged over the remaining surfaces of the component. The interfacial energy is understood here to mean the energy that must be converted in order to increase the interface between the molten solder material and a material adjoining it by 1 m² under isothermal conditions.

For example, the materials are selected such that the molten solder material wets the material of the mounting side with a contact angle of at most 90° or at most 60° or at most 30°. The materials of the side surfaces and the top side are for example wetted by the molten solder material with a contact angle of at least 50° or at least 80° or at least 90° or at least 120°. The specified angles relate in particular to the case that in each case only one drop of the liquid solder material is applied to a much larger area.

Preferably, the surface energy of the molten solder material is also larger, for example 5 times or at least 10 times or at least 50 times or at least 100 times larger than the interfacial energy between the molten solder material and the mounting side. In the present case, surface energy is understood as meaning the interfacial energy at an interface to a gaseous medium, such as air.

In order to achieve the good wettability of the mounting side, it may be partially, for example to at least 50% or to at least 60% or to at least 70% or to at least 80%, or entirely made of metal. For example, the top side and/or the side surfaces are formed to at most 30% or at most 10% or at most 5% of metal.

According to at least one embodiment, the method comprises a step B) in which a carrier with pigment landing areas is provided. The carrier is preferably an electrical connection carrier for the electronic components. In normal operation the connection carrier then serves, for example, for electrical contacting and energization of the components. For this purpose, the carrier comprises, for example, metal connection areas.

The pigment landing areas are, in particular, regions on a connection side of the carrier which are set up to capture the components. For example, each pigment landing area is adapted to receive and capture a single component. The pigment landing areas can be formed for example by electrical connection elements of the carrier. In particular, the pigment landing areas are contiguous, preferably simply connected, metallic surfaces which are exposed on the connection side of the carrier before the components are applied.

The lateral extent of a pigment landing area along the connection side of the carrier is, for example, at least 50% or at least 100% or at least 150% of the lateral extent of the components. Alternatively or additionally, the lateral extent of the pigment landing areas is at most 300% or at most 200% or at most 150% of the lateral extent of the components.

According to at least one embodiment, the materials of the carrier are selected such that the pigment landing areas have a higher or stronger or better wettability with the molten solder material of the pigments than the regions laterally adjacent to the pigment landing areas. Furthermore, the pigment landing areas have higher wettability with the molten solder material than the side surfaces and than the top sides of the components.

That is, the materials on the outer surface of the carrier are selected such that the molten solder material preferably wets the pigment landing areas of the carrier. In particular, the pigment landing areas are wetted by the molten solder material to at least 50% or at least 70% or at least 90%. The regions of the carrier outside the pigment landing areas are for example wetted by the molten solder material not at all or in terms of area to at most 20% or at most 10% or at most 5%. In particular, the contact angle or critical angle between the molten solder material and the pigment landing areas is smaller, for example at least 20° or at least 40° or at least 60° smaller, than between the molten solder material and regions laterally adjacent to the pigment landing areas.

In particular, for example, the interfacial energy averaged over the entire area of the pigment landing area is smaller, for example at least 5 times or at least 10 times or at least 50 times or at least 100 times smaller, than the interfacial energy averaged over the areas of the regions between the pigment landing areas. Preferably, the interfacial energy averaged over the pigment landing areas is also smaller, for example at least 5 times or at least 10 times or at least 50 times or at least 100 times smaller, than the interfacial energy averaged over the side surfaces and top sides of the components and than the surface energy of the molten solder material.

In order to ensure the good wettability of the pigment landing areas, the pigment landing areas may be formed in particular metallic. The regions of the carrier laterally adjacent to the pigment landing areas are for example made of an electrically insulating material. For example, these regions are coated with an anti-wetting layer, for example of organic material, such as a solder resist, or of inorganic material, such as silicon oxide, in order to reduce or prevent wetting of these regions with the molten solder material.

According to at least one embodiment, in a step C) the pigments are applied to the carrier. For applying the pigments to the carrier, for example, a printing method or a setting method or solder-ball-jetting can be used. In particular, the pigments are applied to the side of the carrier on which the pigment landing areas are arranged. In particular, on each pigment landing area exactly one pigment or more pigments are applied. Preferably, after application, no two pigments are in direct contact with each other.

According to at least one embodiment, the method comprises a step D) in which the pigments are heated such that the solder material, preferably the entire solder material, of each pigment melts. Minimization of the surface energy and the interfacial energy then causes the molten solder material of each pigment to wet a pigment landing area and thereby the component of the corresponding pigment is positioned on the pigment landing area with the mounting side facing the carrier.

The pigments are preferably heated to temperatures above the liquidus temperature of the solder material, so that the solder material completely melts.

The melting of the solder material can also be carried out before the application of the pigments to the carrier.

In particular, in step D) the automatic alignment and positioning of the components on the carrier with help of the liquid solder material is utilized. By having the wettability of the mounting side and of the pigment landing areas with the molten solder material higher than the wettability in the other regions of the substrate or of the component, the molten solder material tries to wet the pigment landing areas and the mounting side and to align them opposite to each other as much as possible in order to minimize the surface energy and interfacial energy. This also results in the molten solder material preferably being arranged between the mounting side and the pigment landing area. For example, at least 75% by volume or at least 85% by volume or at least 93% by volume or at least 96% by volume of the original solder material is then disposed between the mounting side and the pigment landing area. As a consequence, the mounting side is then generally facing the carrier for each component. The top side of each component is generally facing away from the carrier.

According to at least one embodiment, the steps A) to D) are carried out successively in the stated order. But it is also possible that the solder material is brought to melt before applying the pigments to the carrier.

In at least one embodiment, the method for assembling a carrier with components comprises a step A), in which a plurality of pigments is provided. Each pigment comprises an electronic component with a mounting side, at least one side surface running transversely to the mounting side and a top side opposite the mounting side. Furthermore, each pigment comprises a meltable solder material, which directly adjoins the mounting side of the component and which is soldered to the mounting side cohesively. At least 63% by volume of each pigment is formed by the solder material. For each component, the materials of the solder material, of the mounting side, of the side surface and of the top side are selected such that the mounting side has a higher wettability with the molten solder material than the top side and the side surface. In a step B) of the method, a carrier with pigment landing areas is provided, wherein the materials of the carrier are selected such that the pigment landing areas have a higher wettability with the molten solder material of the pigments than the regions laterally adjacent to the pigment landing areas and than the side surfaces and the top sides of the components. In a step C), the pigments are applied to the carrier. In a step D), the pigments are heated such that the solder material of each pigment melts, wherein, by minimization of the surface energy and interfacial energy, the molten solder material of each pigment wets a pigment landing area and the component of the corresponding pigment is positioned on the pigment landing area with the mounting side facing the carrier.

The present invention is based in particular on the idea of placing a large number of small components, such as light-emitting diodes (LEDs), in a targeted manner. For this purpose, the automatic placement and alignment of components on a carrier by means of a liquid is exploited. In particular, components are used which are initially encased in an easily meltable material to produce a printable element (pigment). During printing, the material is melted, the molten material centers the component on the pigment landing area, aligns it in a predetermined orientation and fixes it on the carrier upon solidification.

The present invention is based, inter alia, on the recognition that by selectively adjusting the wettabilities of certain regions of the component and of the carrier, the orientation of the components after the automatic placement and alignment can be predetermined. It can thus be achieved that the components are always or almost always positioned with the same side, namely the mounting side, facing the carrier. The top side of the components, which for example forms a luminous surface of the components, is then always facing away from the carrier.

The method described herein also offers the advantage that the components can be set very quickly. Conventional gripping and setting of the chips can be dispensed with. Therefore, the components need not comply with a minimum size of at least 90 µm or at least 100 µm or at least 150 µm edge length. In particular, much smaller components can be processed and set in a targeted manner by the method specified herein.

According to at least one embodiment, the pigments in step A) selected such that the solder material of each pigment completely surrounds the component. That is, each component is covered by the solder material on all outer surfaces. For example, the solder material is in direct contact with the component on all outer surfaces of the component. The solder material then preferably surrounds the component in a form-fitting and complete manner. The solder material thus forms a complete, integrally formed enclosure of the component.

According to at least one embodiment, in step A) an edge surface of each pigment is formed by the solder material, in particular completely formed by the solder material. In other words, an interface of the pigment that limits the pigment in all directions is formed by the solder material. In particular, only solder material is arranged between the component and the interface or edge surface or outer surface of the pigment.

According to at least one embodiment, each pigment is substantially spherical. Essentially spherical means that the edge surface forms a spherical surface within the manufacturing tolerance, whereby production-related deviations from a mathematically perfect shape can occur. For example, substantially spherical pigments may have a curvature that tends to an elliptical shape. Substantially spherical pigments can be processed and applied to the carrier particularly easily, for example by means of solder-ball-jetting.

According to at least one embodiment, in step A), for each pigment, the solder material forms a sphere on the mounting side. In particular, the solder material covers only or predominantly the mounting side. The top side and the side surfaces may be free of the solder material. For example, at least 90%, or at least 95%, or at least 99% of the solder material is disposed on the mounting side of the component in step A).

The fact that the solder material forms a sphere on the mounting side means that the solder material essentially forms a solid sphere on the mounting side. In particular, in the transition between the solder material and the mounting side, the shape of the solder material deviates from a spherical shape. Also elliptical curvatures, caused for example by manufacturing tolerances, can occur. Even with such a form, the pigments can be applied particularly easily to the carrier.

According to at least one embodiment, the components of the pigments are LEDs. For example, the LEDs emit predominantly red or green or blue or white light or UV radiation or IR radiation during normal operation. In particular, each pigment comprises exactly one LED.

According to at least one embodiment, the solder material is a metal, such as gallium, indium, bismuth, silver, copper, gold, zinc, lead or tin, or a metal alloy of these metals, such as galinstan (GaInSn), GaIn, BiIn, SnAgCu, SnCu, AuSn, InSn, AgIn, SnZn, AgSn, AuBi, AgBi.

According to at least one embodiment, the solder material used is a metal or a metal alloy in which the liquidus or solidus point is at least 60° C. or at least 100° C. or at least 120° C. Alternatively or additionally, the liquidus point or solidus point is at most 450° C. or at most 300° C. or at most 260° C.

For example, the solder material has a surface energy of at least 150 mJ/m$^2$ or at least 200 mJ/m$^2$ or at least 300 mJ/m$^2$ or at least 500 mJ/m$^2$.

According to at least one embodiment, the components of the pigments each have a diameter or a lateral extent along the mounting side of at most 100 µm or at most 50 µm or at most 20 µm or at most 10 µm. Especially for small components, the method described herein is advantageous, because such small components can be difficult to grip and set.

According to at least one embodiment, the top sides of the components each form light outcoupling surfaces of the components. For example, for each component at least 15% or at least 30% or at least 50% or at least 80% or at least 90% or at least 95% of the electromagnetic radiation emitted by the component in total are coupled out via the top side during normal operation.

According to at least one embodiment, in step A) the pigments are introduced into a liquid. The liquid may be, for example, water or oil or silicone oil or ethylene glycol. In particular, the liquid together with the pigments forms an ink. The ink is applied to the carrier in step C). Within the liquid, the pigments are preferably freely movable and in particular are not permanently connected to one another.

According to at least one embodiment, in step C) the liquid with the pigments is applied via an inkjet printer. With the help of the inkjet printer it can be accurately determined on which regions of the carrier components are placed. In particular, with the help of the inkjet printer, the liquid with the pigments can be printed only in the region of the pigment landing areas, which increases the efficiency of assembling the carrier.

According to at least one embodiment, the pigments are applied in step C) via solder-ball-jetting. When solder-ball-jetting, the pigments are shot in a targeted manner onto specific regions of the carrier with the help of a nozzle. Solder-ball-jetting or solder-sphere-jetting is described, for example, in the paper "Wafer level solder bumping and flip chip assembly with solder balls down to 30 µm" by Thomas Oppert et al., the disclosure of which is hereby incorporated by reference.

According to at least one embodiment, a stamp is equipped with a plurality of pigments before step C). For example, such a stamp has a plurality of recesses into which pigments can be sucked by means of negative pressure and can be held by the negative pressure within the recesses. In step C), the pigments can then be placed to predetermined positions on the carrier by means of the stamp. This so-called Wafer Level Solder Sphere Transfer (WLSFT) is also described in the aforementioned paper.

According to at least one embodiment, each pigment has a first contact element serving for electrically contacting the component on the mounting side and a second contact element serving for electrical contacting the component on the top side. After arranging the components on the pigment landing areas, for example, the first contact element is electrically conductively connected to the carrier via the solder material. In this case, the pigment landing surface forms in particular an electrical connection element for the component. The second contact element can then be contacted electrically, for example, via an additional contact wire or a conductor track.

According to at least one embodiment, for each pigment a first contact element serving for electrical contacting the component and a second contact element serving for electrical contacting the component are arranged on the mounting side. In this case, the component is, in particular, a surface-mountable component in which all contact elements necessary for contacting the component are arranged on the mounting side. Both contact elements can be electrically conductively connected, for example via the solder material, with corresponding connection elements on the carrier.

In addition, a pigment is specified for assembling a carrier with a component. The pigment is particularly suitable as a pigment for the method for assembling a carrier described herein. All features disclosed in connection with the pigment are therefore also disclosed for the method for assembling a carrier and vice versa.

According to at least one embodiment, the pigment for assembling a carrier comprises an electronic component with a mounting side, at least one side surface running transversely to the mounting side and a top side opposite the mounting side.

According to at least one embodiment, the pigment comprises a meltable solder material which directly adjoins the mounting side of the component and is soldered to the mounting side cohesively. The meltable solder material is preferably cured at room temperature, more preferably at temperatures below 100° C. The meltable solder material can also be liquid at room temperature.

According to at least one embodiment, the solder material is connected exclusively to the component via a cohesive solder connection. Except with the component, the solder material is thus connected to no other electronic component via a cohesive solder connection. In particular, the component is not electrically connected. Thus, the solder material is preferably permanently mechanically connected only to the component. The solder material is not soldered to any other components, in particular to any electrical connection carrier or carrier. Any further mechanical contact of the solder material to an element other than the component is, for example, non-destructively releasable again.

According to at least one embodiment, at least 63% by volume of the pigment is formed by the solder material.

According to at least one embodiment, the materials of the solder material, the mounting side, the side surface and the top side are selected such that the mounting side has a higher wettability with the molten solder material than the top side and than the side surfaces of the component.

Preferably, the pigment is substantially spherical and has a diameter of at most 500 µm or at most 300 µm or at most 100 µm or at most 50 µm. In particular, the pigment or the edge surface of the pigment is not in any non-detachable connection to another component.

In addition, a pigment mixture is specified. In particular, the pigment mixture comprises a plurality of the pigments described herein. Each feature disclosed in connection with the pigment mixture is therefore also disclosed for the pigment and vice versa.

According to at least one embodiment, the pigment mixture comprises a plurality of pigments which are freely movable in the pigment mixture. For example, the pigment mixture comprises a liquid in which the pigments are incorporated. Each pigment may then preferably move independently of the other pigments within the liquid.

Alternatively, however, the pigment mixture can also consist exclusively of the pigments. For example, between the pigments there is only gas or air, but especially no liquid. The pigments can be in direct contact with each other but are not soldered to each other. In particular, the contact between the pigments is therefore not permanent, but, for example, by shaking the pigment mixture the contact is detachable. By shaking the pigment mixture, for example, the pigments can be redistributed within the pigment mixture.

In addition, a method for producing a pigment is provided. The method is particularly suitable for the production of a pigment described herein. All features disclosed in connection with the pigment are therefore also disclosed for the method and vice versa.

According to at least one embodiment, the method for producing a pigment comprises a step A), in which an electronic component is provided with a mounting side, at least one side surface running transversely to the mounting side and a top side opposite the mounting side.

According to at least one embodiment, the method for producing a pigment comprises a step B), in which a meltable solder material is applied to the mounting side and to the top side. The solder material can, for example, be vapor-deposited or sputtered on or applied electrochemically (galvanically).

According to at least one embodiment, the materials of the solder material, of the mounting side, of the side surface and of the top side are selected such that the mounting side has a higher or better or stronger wettability with the molten solder material than the top side and the side surface.

According to at least one embodiment, the volume of solder material applied to the mounting side and to the top side is at least 1.7 times larger, or at least 2 times larger, or at least 3 times larger, or at least 4 times larger, or at least 5 times larger, or at least 6 times larger, or at least 10 times larger than the volume of the component.

According to at least one embodiment, the solder material is melted in a step C) such that at least the mounting side is wetted by the liquid solder material and the mounting side enters into a cohesive solder joint with the solder material. In particular, the liquid solder material contracts and re-encloses the mounting side or the component.

According to at least one embodiment of the method, the solder material is cured in a step D). By curing of the solder material a solid pigment is produced whose interface or edge surface is not deformed under normal mechanical loads.

According to at least one embodiment, steps A) to D) are carried out successively in the stated order.

In the following, a method for assembling a carrier with components described herein, a pigment for assembling a carrier with a component described herein, and a method for producing a pigment described herein will be explained in more detail with reference to drawings by means of exemplary embodiments. The same reference numerals indicate the same elements in the individual figures. However, no scale relationships are shown, but individual elements may be exaggerated for better understanding.

Figure 2A:
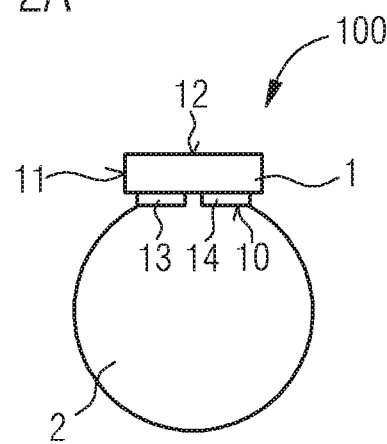
Figure 2B:
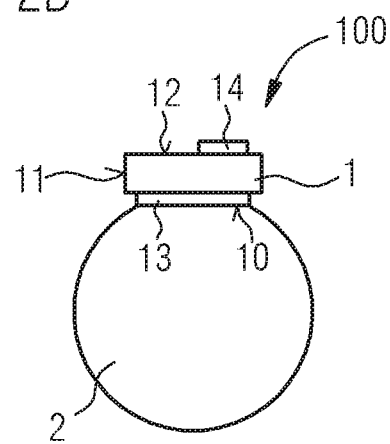

As shown in:

FIGS. 1, 2A and 2B an exemplary embodiment of a pigment mixture and exemplary embodiments of pigments in side view, FIGS. 3A to 4C various positions in exemplary embodiments of the method for assembling the carrier with components, and FIGS. 5A to 5H various positions of an exemplary embodiment of the method for producing a pigment.

FIG. 1 shows an exemplary embodiment of a pigment mixture 1000. The pigment mixture 1000 comprises a plurality of pigments 100 arranged in a container. The pigments 100 are in contact with each other, but are not permanently mechanically connected. By shaking the container, for example, the pigments 100 are remixed. In particular, each pigment 100 has a hard outer surface or edge surface so that the contact with the other pigments 100 does not result in deformation of the outer surfaces.

Unlike in FIG. 1, the pigments 100 can also be introduced into a liquid and, for example, swim or float within the liquid.

In addition, the enlargement of a pigment 100 is shown in FIG. 1. The pigment 100 comprises a surface-mountable optoelectronic component 1. The component 1 is, in particular, an LED or an LED chip. The LED chip comprises, for example, an AlGaInN semiconductor layer sequence with an active layer in the form of a pn junction or a quantum well structure.

The component 1 further comprises a mounting side 10, side surfaces 11 and a top side 12. The mounting side 10 and the top side 12 form substantially parallel main sides of the component 1. The side surfaces 11 connect the top side 12 with the mounting side 10. The mounting side 10 comprises two contact elements 13, 14 for electrical contacting of the component 1.

The component 1 has, for example, an edge length in the lateral direction, that is to say parallel to the mounting side 10, of 3 µm and a thickness of 1 µm.

Furthermore, the pigment 100 comprises a meltable, preferably cured solder material 2. The solder material 2 is, for example, Sn. The solder material 2 surrounds the component 1 completely and in a form-fitting manner. That is, the component 1 is completely enclosed in the solder material 2. The component 1 is therefore covered on all sides by the solder material 2.

In the present case, the pigment 100 has a spherical shape. In the present case, an outer surface or edge surface 101 of the pigment 100 is completely formed by the solder material 2. Apart from the solder material 2 and the component 1, the pigment 100 does not comprise any further components or other materials.

The diameter of the sphere is about 4.4 µm, so that about 80% by volume of the pigment 100 is formed by the solder material 2.

In the pigment 100, the materials of the mounting side 10, of the side surfaces 11, of the top side 12 and of the solder material 2 are selected such that the mounting side 10 has a higher wettability with the molten solder material 2 than the other sides, i.e. in particular than the side surfaces 11 and than the top side 12 of the component 1. In the present case, a high wettability of the mounting side 10 with the molten solder material 2 is obtained in particular by the fact that the mounting side 10 is predominantly formed by the metallic contact elements 13, 14.

FIG. 2A shows a side view of a further exemplary embodiment of a pigment 100. Unlike in FIG. 1, the solder material 2 does not surround the entire component 1, but forms a sphere on the mounting side 10. In particular, the contact elements 13, 14 on the mounting side 10 are covered by the solder material 2. In the present case, for example, at least 90% by volume of the solder material 2 is arranged on the mounting side 10.

In the exemplary embodiment of FIG. 2B, a pigment 100 is shown, in which only a first contact element 13 is arranged on the mounting side 10. In the present case, the first contact element 13 forms, for example, at least 80% of the mounting side 10 of the component 1. For example, via the first contact element 13, holes or electrons are injected into the component 1 during normal operation of the component 1. On the top side 12, a second contact element 14 is arranged, which forms a counter contact to the first contact element 13. For example, electrons or holes are injected into the component 1 via the second contact element 14 during normal operation.

In the present case, the solder material 2 again forms a sphere, which is arranged on the mounting side 10. Due to the fact that the mounting side 10 is formed predominantly by the metallic first contact element 13, the mounting side 10 has a particularly high wettability with the solder material 2. For example, since the side surfaces 11 and the top side 12 are formed by metallic material only to a lesser extent or not at all, the wettability of the side surfaces 11 and the top side 12 with the liquefied solder material 2 is lower.

The arrangement of only a first contact element 13 on the mounting side 10 and a second contact element 14 on the top side 12 can also be realized when the component 1 is completely surrounded by the solder material, as shown in the exemplary embodiment of FIG. 1.

Figure 3A:
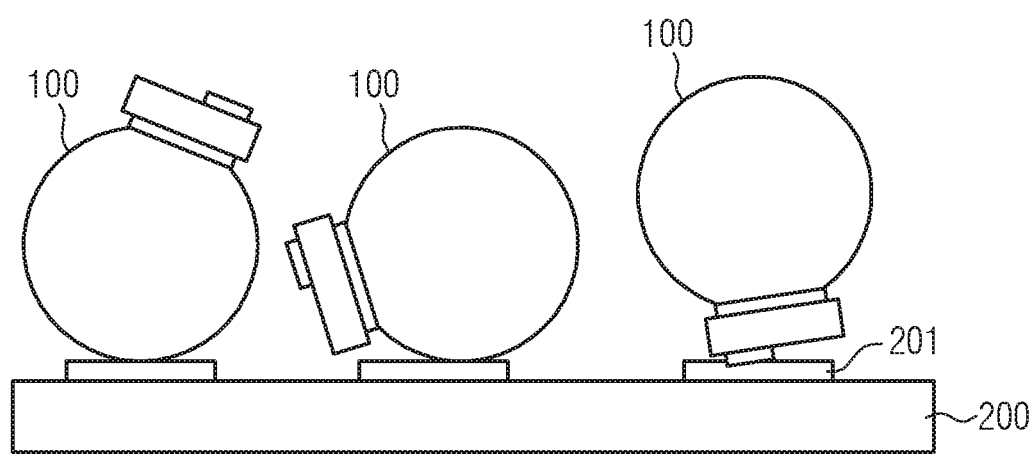

FIG. 3A shows a first position in the method for assembling a carrier with components. It can be seen that a carrier 200 is provided with laterally spaced pigment landing areas 201. The carrier 200 is, for example, an electrical connection carrier 200 for the components 1. The pigment landing areas 201 are, for example, contiguous, exposed, metallic areas at the connection side of the carrier 200, which are set up for electrical contacting of the components 1. The lateral extent of the pigment landing areas 201 along the connection side is approximately 4.5 The regions laterally adjacent to and between the pigment landing areas 201 are formed, for example, from an electrically insulating material, such as plastic.

The materials of the pigment landing areas 201 and of the remaining regions of the substrate 200 are presently selected such that the pigment landing areas 201 have a higher wettability with the liquid solder material 2 of the pigments 100 than the remaining regions laterally around the pigment landing areas 201. Furthermore, the pigment landing areas 201 have better wettability with the solder material 2 than the side surfaces 11 and the top side 12 of the components 1 of the pigments 100.

FIG. 3A shows how a pigment 100 is applied to each pigment landing area 201. In the position of FIG. 3A, however, the components 1 are not yet permanently connected to the connection carrier 200. For example, the pigments 100 are only applied to the carrier 200.

Figure 3B:
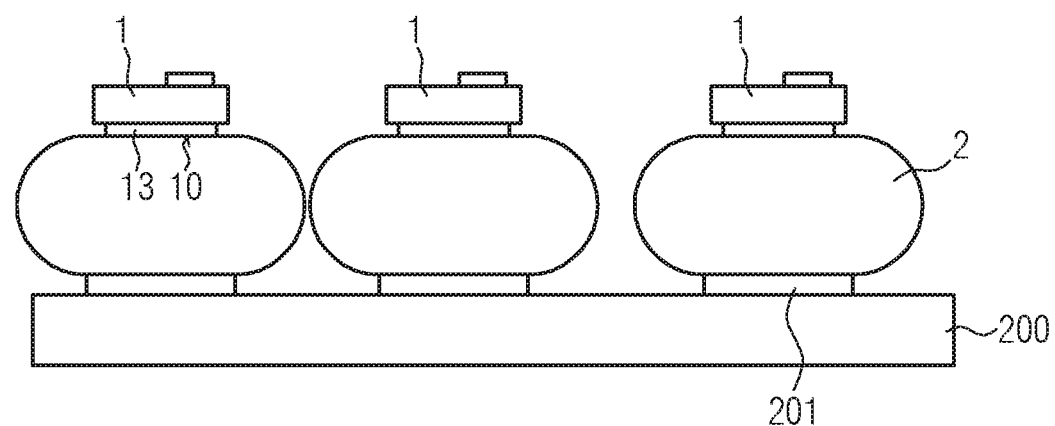

FIG. 3B shows a second position in the method. In this position, the components 1 are mechanically permanently connected to the connection carrier 200 via the solder material 2. In particular, the components 1 are soldered onto the pigment landing areas 201 by means of the solder material 2. The top sides 12, which serve in particular as illumination surfaces, all point away from the carrier 200. The mounting sides 10 are facing the carrier 200 in each case.

In order to obtain the arrangement of FIG. 3B, the pigments 100 of FIG. 3A were heated until the solder material 2 of the pigments 100 has liquefied. Due to the fact that the wettability of the mounting side 10 of the components 1 and of the pigment landing areas 201 is higher than the wettability of the remaining regions of the components 1 and the carrier 200, the components 1 were automatically aligned such that the mounting side 10 faces the pigment landing areas 201 and were connected to each other via the liquid solder material 2. This happened automatically via the minimization of the surface energy and interfacial energy of the liquefied solder material 2.

In FIG. 3B, the position is shown after the liquefied solder material 2 has been cured again. An electrical solder joint between the first contact elements 13 and the pigment landing areas 201 is produced via the solder material 2.

Figure 4A:
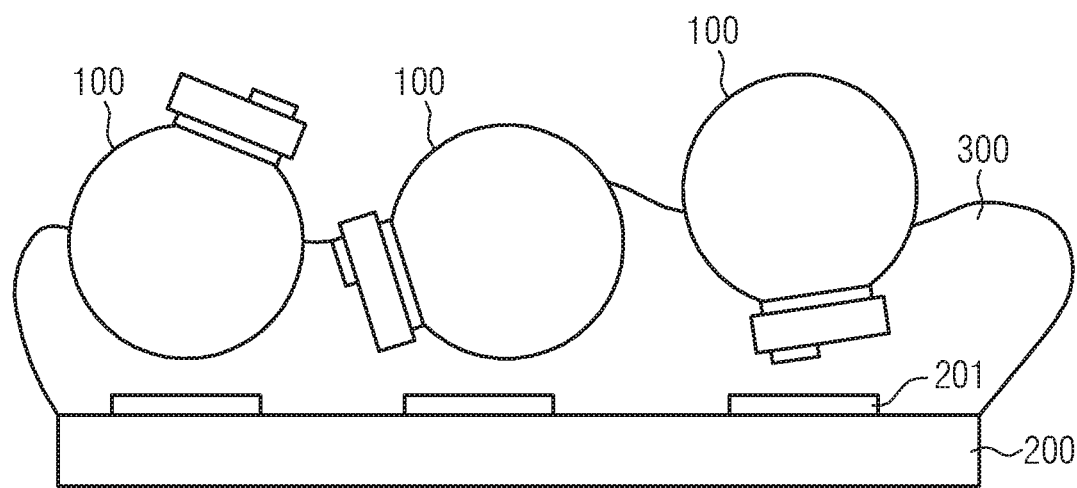

FIG. 4A shows a position in an exemplary embodiment of the method in which, unlike in FIG. 3A, the pigments 100 are applied to the carrier 200 together with a liquid 300, such as water or oil or silicone oil. The liquid 300 together with the pigments 100 forms, for example, an ink. The ink can be applied to the carrier 200 in a targeted manner in the region of the pigment landing areas 201 via an inkjet printer or aerosol jetting.

After or before the melting of the solder material 2 of the individual pigments 100, the liquid 300 can be removed, for example by evaporation. After the solder material 2 has been melted, the components 1 automatically align themselves in the correct orientation on the pigment landing areas 201. After curing of the solder material 2, the apparatus shown in FIG. 3B is obtained.

Figure 4B:
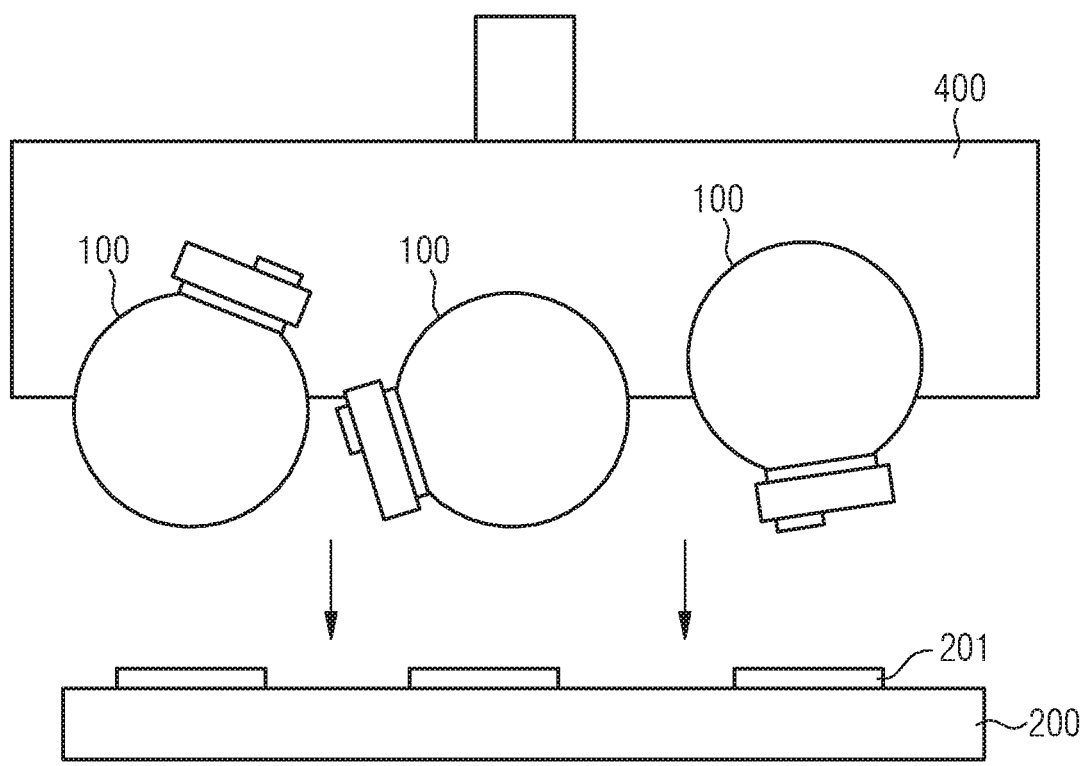

FIG. 4B shows a position in an exemplary embodiment of the method in which a stamp 400 is used to apply the pigments 100 to the carrier 200. The stamp 400 has recesses, for example, into which the pigments 100 fit. With help of negative pressure, the pigments 100 can be kept within the recesses as long as the stamp 400 is aligned above the carrier 200. After aligning the stamp 400, the negative pressure is turned off, for example, and the pigments 100 are placed on the intended pigment landing areas 201. Subsequently, the solder material 2 of the pigments 100 is again melted, which, due to the minimization of the surface energy and interfacial energy of the molten solder material 2, leads to the automatic and correct alignment of the components 1 on the carrier 200.

Figure 4C:
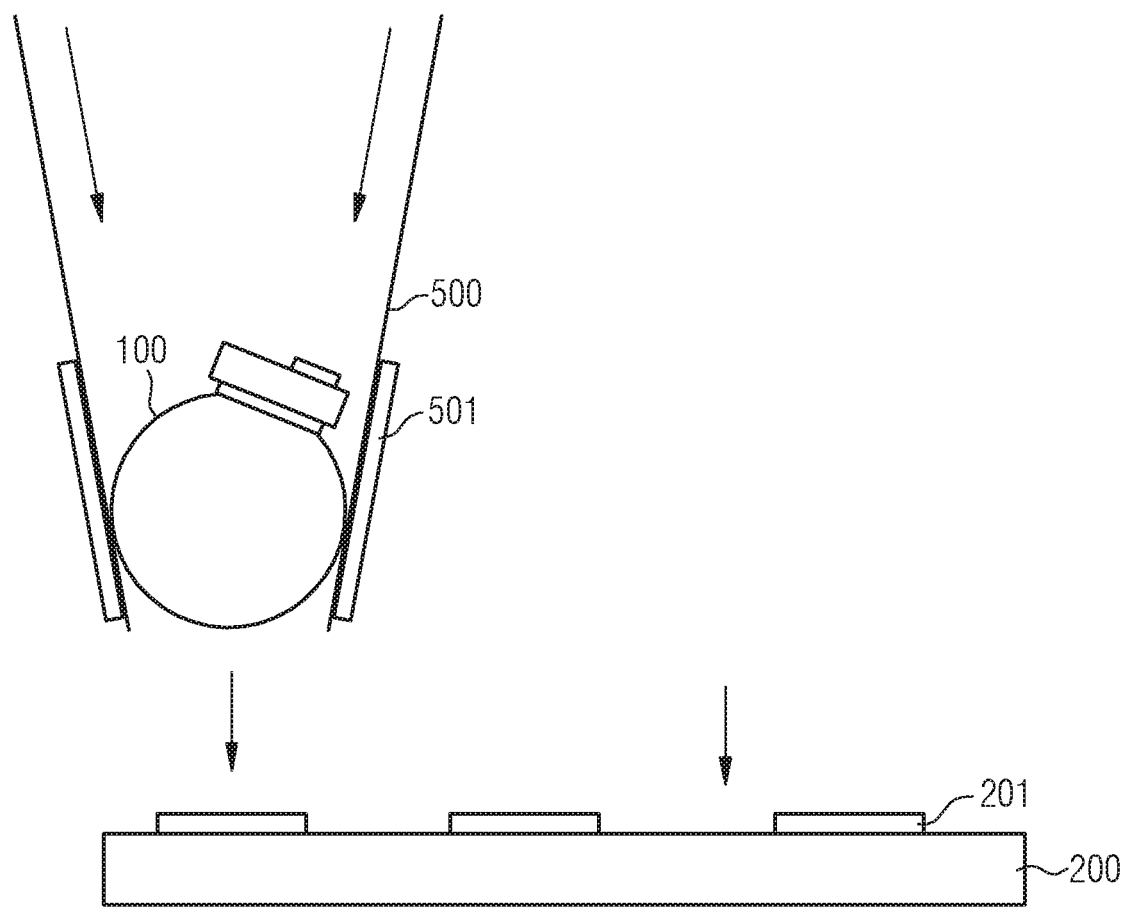

FIG. 4C shows a position in an exemplary embodiment of the method in which the pigments 100 are applied to the carrier 200 by means of so-called solder-ball-jetting. Solder-ball-jetting uses a nozzle 500. The opening of the nozzle 500 is slightly smaller than the diameter of the pigments 100. By heating the opening of the nozzle 500 by means of heating elements 501, the solder material 2 is melted for a short time. A gas flow then causes the pigments 100 to be squeezed through the opening of the nozzle 500 and to be placed on the carrier 200 or on the intended pigment landing area 201. After placing the pigments 100, they are again aligned automatically and correctly on the carrier 200 by melting the solder material 2.

In particular, spherical pigments as shown in FIG. 1 can also be used in the processes of FIGS. 4B and 4C.

Figure 5A:
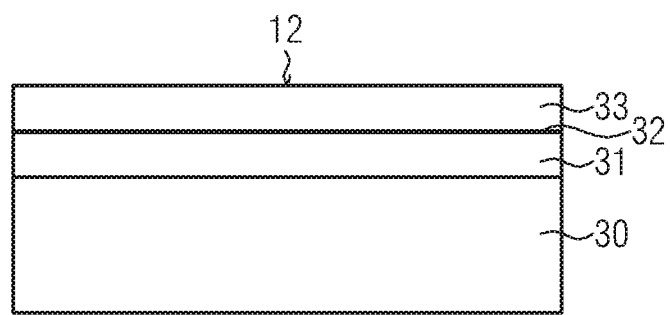

In FIG. 5A, a first position of a method for producing a pigment 100 is shown. For this purpose, a growth substrate 30, for example a sapphire substrate 30, is provided. On the growth substrate 30, a semiconductor layer sequence 31, 32, 33, which is based for example on AlInGaN, is grown. For example, the semiconductor layer 31 is an n-type layer, the semiconductor layer 33 is a p-type layer. The layer 32 is an active layer, via which electromagnetic radiation is generated during normal operation. A top side 12 is formed on a side of the semiconductor layer sequence 31, 32, 33 opposite the growth substrate 30. Unlike in FIG. 5A, a contact element for electrical contacting of the semiconductor layer sequence 31, 32, 33 can be arranged on the top side 12.

The lateral extent of the semiconductor layer sequence 31, 32, 33 along the main extension direction of the active layer 32 is, for example, 3 The thickness of the semiconductor layer sequence 31, 32, 33 is, for example, 1 µm.

Figure 5B:
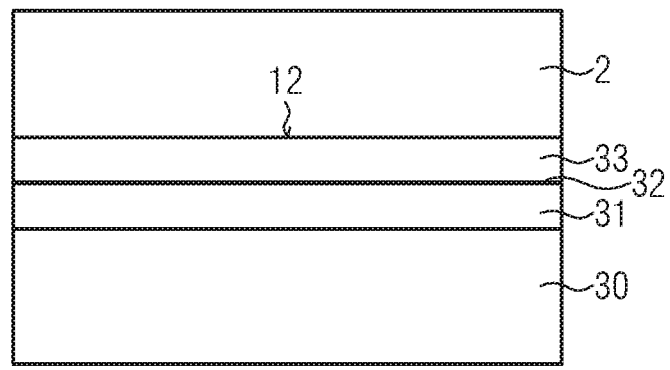

In a second position of the method, which is illustrated in FIG. 5B, a 2 µm thick layer of the solder material 2, for example of Sn, is applied to the top side 12. The solder material 2 may, for example, be vapor-deposited or sputtered.

Figure 5C:
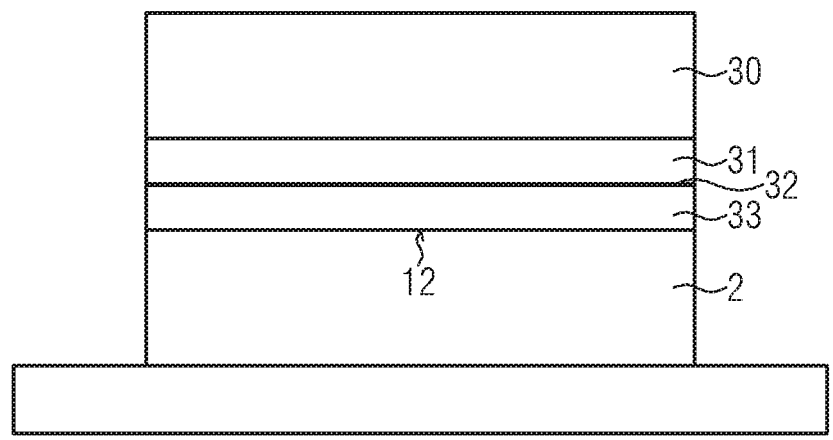

In a third position of the method, which is illustrated in FIG. 5C, the composition of the growth substrate 30, the semiconductor layer sequence 31, 32, 33 and the layer of the solder material 2 is applied to an auxiliary carrier so that the growth substrate 30 is exposed on a side of the semiconductor layer sequence 31, 32, 33 facing away from the auxiliary carrier.

Figure 5D:
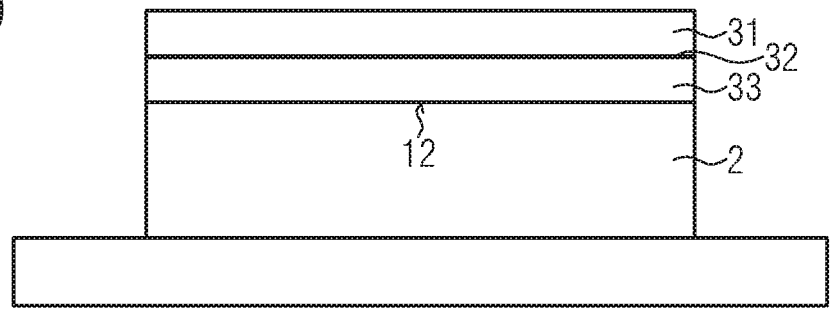

In the position of the method shown in FIG. 5D, the growth substrate 30 is detached from the semiconductor layer sequence 31, 32, 33, for example via a laser lift-off process.

Figure 5E:
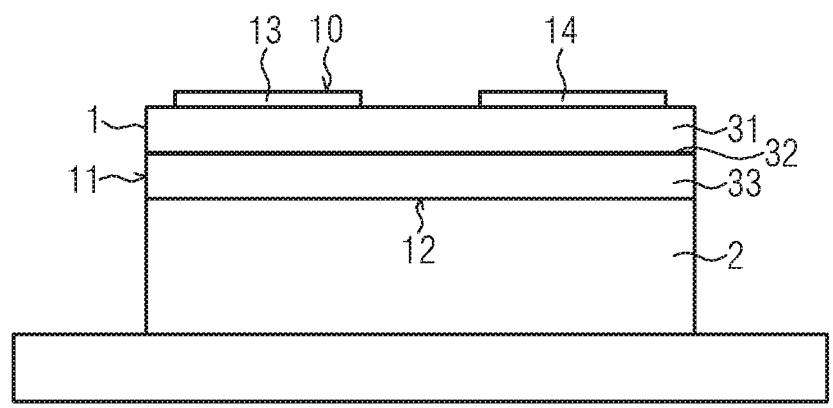

FIG. 5E shows a position in the method in which, after detachment of the growth substrate 30, the n-type semiconductor layer 31 has been equipped with a first contact element 13 and a second contact element 14, whereby a mounting side 10 has been created. The contact elements 13, 14 are used in the normal operation for electrical contacting of the semiconductor layer sequence 31, 32, 33. By applying the contact elements 13, 14, an optoelectronic component 1 in the form of an LED chip is completed. The mounting side 10 and the top side 12 are connected to each other via side surfaces 11 of the component 1.

In the case described above, in which a contact element has already been arranged on the top side 12, only one contact element is attached to the mounting side 10, for example.

Figure 5F:
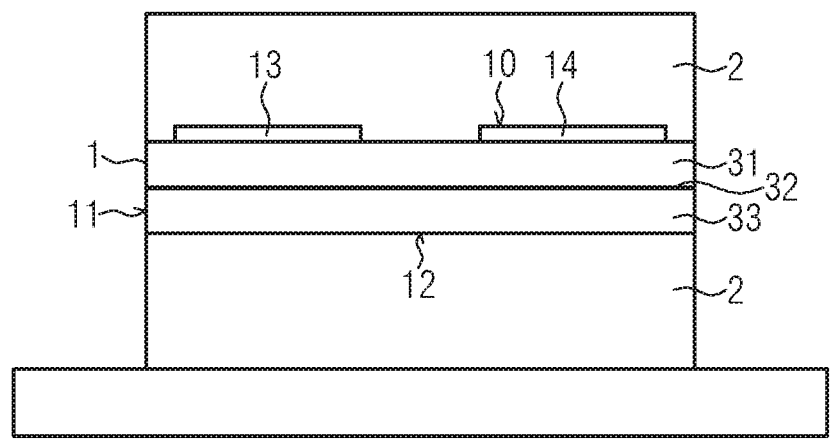

In the position of FIG. 5F, a further, 2 μm thick layer of the solder material 2, is then applied to the mounting side 10, for example, again via sputtering or vapor deposition.

Figure 5G:
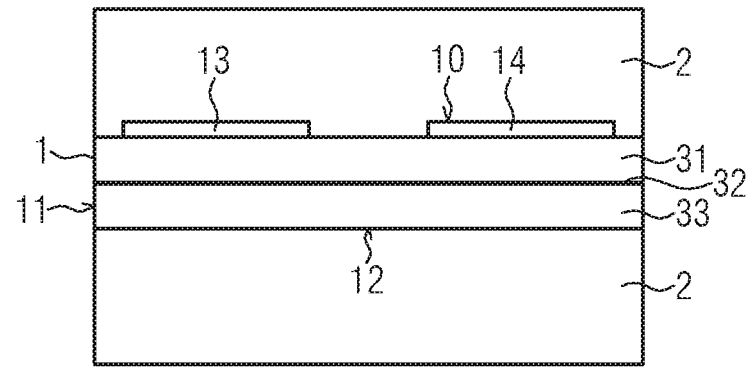

In the position of the method shown in FIG. 5G, the auxiliary carrier is detached again. The mounting side 10 and the top side 12 of the component 1 are completely covered by layers of the solder material 2.

Figure 5H:
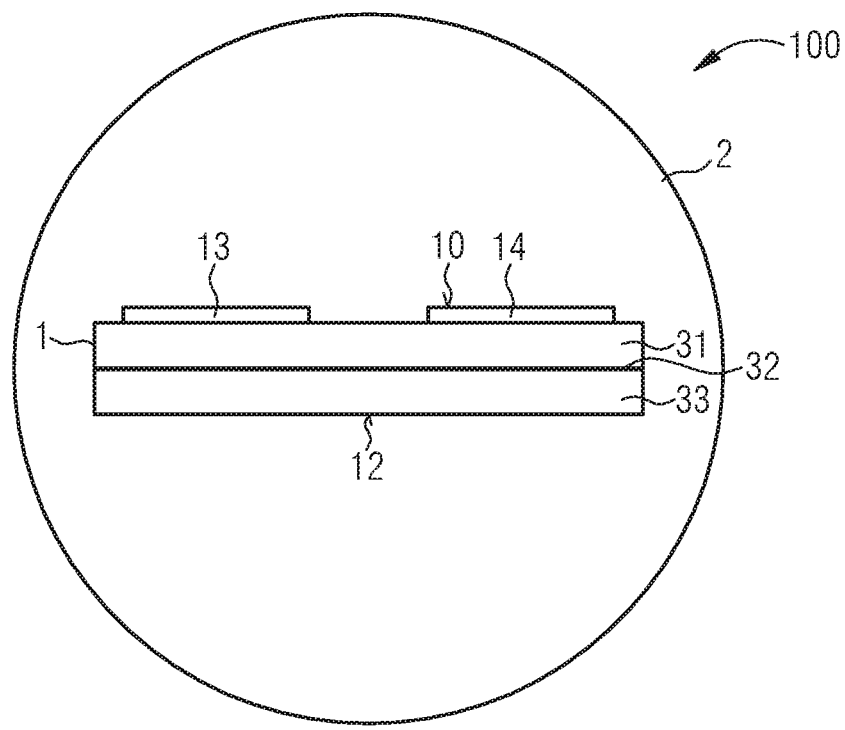

FIG. 5H shows a position of the method which follows the position of FIG. 5G. By heating the solder material 2 above the liquidus temperature, the solder material 2 from the mounting side 10 and from the top side 12 has fused and has completely coated the component 1, resulting in a substantially spherical pigment 100 after re-curing of the solder material. The edge surface or outer surface of the pigment 100 is completely formed by solidified solder material 2.

This patent application claims the priority of German Patent Application 10 2017 115 410.8, the disclosure of which is hereby incorporated by reference.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

LIST OF REFERENCE NUMERALS 1 electronic component
2 solder material
10 mounting side
11 side surface
12 top side
13 first contact element
14 second contact element
30 growth substrate
31 semiconductor layer
32 active layer
33 semiconductor layer
100 pigment
101 edge surface
200 carrier
201 pigment landing area
300 liquid
400 stamp
500 nozzle
501 heating element
1000 pigment mixture

The invention claimed is:

1. A method for assembling a carrier with components, comprising the steps of:
A) providing a plurality of pigments, wherein each pigment comprises
an electronic component having a mounting side, at least one side surface running transversely to the mounting side and a top side opposite the mounting side,
a meltable solder material, which directly adjoins the mounting side of the component and which is soldered to the mounting side cohesively, wherein
at least 63% by volume of each pigment is formed by the solder material,
the solder material, the mounting side, the at least one side surface and the top side are selected such that the mounting side has a higher wettability with a molten form of the solder material than the top side and the at least one side surface;
B) providing a carrier with pigment landing areas, wherein
the carrier is selected such that the pigment landing areas have a higher wettability with a molten form of the solder material of the pigments than each of regions laterally adjacent to the pigment landing areas, the at least one side surface and the top sides of the components,
C) applying the pigments to the carrier;
D) heating the pigments such that the solder material of each pigment melts, wherein
by minimization of surface energy and interfacial energy, the molten solder material of each pigment wets a pigment landing area and the component of the corresponding pigment is positioned on the pigment landing area with the mounting side facing the carrier.

2. The method according to claim 1,
wherein in step A) for each pigment the solder material completely surrounds the component.

3. The method according to claim 2,
wherein in step A) an edge surface of each pigment is formed by the solder material.

4. The method according to claim 2,
wherein each pigment is substantially spherical.

5. The method according to claim 1,
wherein in step A) for each pigment the solder material forms a sphere on the mounting side.

6. The method according to claim 1,
wherein the components of the pigments are LEDs.

7. The method according to claim 1,
wherein the solder material is a metal or a metal alloy.

8. The method according to claim 1,
wherein the components of the pigments each have a diameter of at most 100 μm.

9. The method according to claim 1,
wherein the top sides of the components each form light out coupling surfaces of the components.

10. The method according to claim 1, wherein
in step A) the pigments are introduced into a liquid,
in step C) the liquid with the pigments is applied on the carrier.

11. The method according to claim 10,
wherein in step C) the liquid with the pigments is applied to the carrier via an inkjet printer or aerosol jetting.

12. The method according to claim 1,
wherein the pigments are applied via solder-ball-jetting.

13. The method according to claim 1, wherein
before the step C) a stamp is equipped with a plurality of pigments,
in step C) the pigments are placed at predetermined positions on the carrier by means of the stamp.

14. The method according to claim 1,
wherein for each pigment a first contact element serving for electrical contacting of the component is arranged on the mounting side and a second contact element serving for electrical contacting of the component is arranged on the top side.

15. The method according to claim 1,
wherein for each pigment a first contact element serving for electrical contacting of the component and a second contact element serving for electrical contacting of the component are arranged on the mounting side.

\* \* \* \* \*